United States Patent
Huang et al.

(10) Patent No.: US 9,837,348 B2
(45) Date of Patent: Dec. 5, 2017

(54) VOIDS IN INTERCONNECT STRUCTURES AND METHODS FOR FORMING THE SAME

(71) Applicant: Taiwan Semiconductor Manufacturing Company, Ltd., Hsin-Chu (TW)

(72) Inventors: Jiun-Jie Huang, Kaohsiung (TW); Ling-Sung Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 14/809,478

(22) Filed: Jul. 27, 2015

(65) Prior Publication Data

US 2015/0333003 A1  Nov. 19, 2015

Related U.S. Application Data

(63) Continuation of application No. 13/539,121, filed on Jun. 29, 2012, now Pat. No. 9,105,634.

(51) Int. Cl.
| | |
|---|---|
| H01L 23/52 | (2006.01) |
| H01L 23/522 | (2006.01) |
| H01L 49/02 | (2006.01) |
| H01L 23/528 | (2006.01) |
| H01L 21/311 | (2006.01) |
| H01L 23/532 | (2006.01) |
| H01L 21/768 | (2006.01) |

(52) U.S. Cl.
CPC .... *H01L 23/5222* (2013.01); *H01L 21/31116* (2013.01); *H01L 21/31144* (2013.01); *H01L 21/7682* (2013.01); *H01L 23/528* (2013.01); *H01L 23/5223* (2013.01); *H01L 23/5226* (2013.01); *H01L 23/5329* (2013.01); *H01L 23/53295* (2013.01); *H01L 28/40* (2013.01); *H01L 28/88* (2013.01); *H01L 28/90* (2013.01); *H01L 23/5227* (2013.01); *H01L 28/10* (2013.01); *H01L 28/20* (2013.01); *H01L 2924/0002* (2013.01)

(58) Field of Classification Search
CPC .................................................. H01L 23/5222
See application file for complete search history.

(56) References Cited

U.S. PATENT DOCUMENTS

| | | |
|---|---|---|
| 5,461,003 A | 10/1995 | Havemann et al. |
| 5,512,775 A | 4/1996 | Cho |
| 5,847,439 A | 12/1998 | Reinberg |
| 5,923,074 A | 7/1999 | Jeng |
| 5,949,143 A | 9/1999 | Bang |
| 6,057,226 A | 5/2000 | Wong |
| 6,159,840 A | 12/2000 | Wang |
| 6,204,165 B1 | 3/2001 | Ghoshal |

(Continued)

OTHER PUBLICATIONS

Tsu et al., "Leakage and breakdown reliability issues associated with low-k dielectrics in a dual-damascene Cu process," Reliability Physics Symposium, 2000. Proceedings. 38th Annual2000 IEEE International, pp. 348-353.

*Primary Examiner* — Caridad Everhart
*Assistant Examiner* — Ankush Singal
(74) *Attorney, Agent, or Firm* — Slater Matsil, LLP

(57) ABSTRACT

A device includes a dielectric layer, a passive device including a portion in the dielectric layer, and a plurality of voids in the dielectric layer and encircling the passive device.

20 Claims, 13 Drawing Sheets

(56) References Cited

U.S. PATENT DOCUMENTS

| | | | |
|---|---|---|---|
| 6,211,561 B1 * | 4/2001 | Zhao | H01L 21/7682 257/522 |
| 6,245,658 B1 | 6/2001 | Buynoski | |
| 6,297,554 B1 | 10/2001 | Lin | |
| 6,426,267 B2 * | 7/2002 | Liou | H01F 41/041 257/E21.022 |
| 6,437,418 B1 * | 8/2002 | Ferrari | H01L 23/5227 257/522 |
| 6,509,623 B2 * | 1/2003 | Zhao | H01L 21/31144 257/522 |
| 6,784,091 B1 | 8/2004 | Nuetzel et al. | |
| 6,984,577 B1 * | 1/2006 | Zhao | H01L 21/76802 257/E21.577 |
| 7,056,822 B1 * | 6/2006 | Zhao | H01L 21/7682 257/E21.581 |
| 7,172,980 B2 | 2/2007 | Torres et al. | |
| 7,229,909 B2 | 6/2007 | Furukawa et al. | |
| 7,238,604 B2 | 7/2007 | Kloster et al. | |
| 7,301,107 B2 | 11/2007 | Karthikeyan et al. | |
| 7,371,684 B2 * | 5/2008 | Colburn | H01L 21/0271 216/13 |
| 7,405,147 B2 * | 7/2008 | Edelstein | B82Y 30/00 257/E21.035 |
| 7,425,501 B2 | 9/2008 | Gotkis et al. | |
| 7,449,407 B2 * | 11/2008 | Lur | H01L 21/76807 257/E21.573 |
| 7,553,756 B2 * | 6/2009 | Hayashi | H01L 21/76802 257/522 |
| 8,049,297 B2 | 11/2011 | Tischler | |
| 8,232,653 B2 * | 7/2012 | Lee | H01L 21/7682 257/751 |
| 8,298,911 B2 * | 10/2012 | Lee | H01L 21/7682 257/758 |
| 8,344,474 B2 | 1/2013 | Seidel et al. | |
| 8,643,187 B1 * | 2/2014 | Dutta | H01L 23/5222 257/773 |
| 8,952,539 B2 * | 2/2015 | Clevenger | H01L 21/02126 257/640 |
| 9,064,841 B2 * | 6/2015 | Huang | H01L 23/5223 |
| 2002/0013034 A1 * | 1/2002 | Liou | H01F 41/041 438/319 |
| 2005/0037604 A1 | 2/2005 | Babich et al. | |
| 2005/0167838 A1 | 8/2005 | Edelstein et al. | |
| 2005/0208752 A1 * | 9/2005 | Colburn | H01L 21/7682 438/619 |
| 2005/0272341 A1 | 12/2005 | Colburn et al. | |
| 2006/0177990 A1 | 8/2006 | Beyer et al. | |
| 2007/0018331 A1 | 1/2007 | Chen | |
| 2007/0040224 A1 * | 2/2007 | Green | H01L 21/31111 257/368 |
| 2007/0184647 A1 | 8/2007 | Furukawa et al. | |
| 2008/0014739 A1 | 1/2008 | Matz et al. | |
| 2008/0020488 A1 | 1/2008 | Clevenger et al. | |
| 2008/0100408 A1 * | 5/2008 | Chen | H01F 17/0006 336/200 |
| 2008/0182403 A1 | 7/2008 | Noori et al. | |
| 2008/0185722 A1 | 8/2008 | Liu et al. | |
| 2009/0093132 A1 | 4/2009 | Xu et al. | |
| 2009/0130863 A1 | 5/2009 | Toma et al. | |
| 2009/0224359 A1 * | 9/2009 | Chang | H01L 23/5223 257/522 |
| 2009/0243045 A1 | 10/2009 | Pagaila et al. | |
| 2010/0206842 A1 | 8/2010 | Gu | |
| 2011/0101492 A1 | 5/2011 | Won et al. | |
| 2011/0156261 A1 | 6/2011 | Kapusta et al. | |
| 2011/0193230 A1 * | 8/2011 | Nogami | H01L 21/0337 257/741 |
| 2011/0260323 A1 | 10/2011 | Yang et al. | |
| 2012/0112361 A1 | 5/2012 | Han et al. | |
| 2012/0153490 A1 | 6/2012 | Vannier | |
| 2012/0193702 A1 | 8/2012 | Machida et al. | |
| 2012/0267753 A1 * | 10/2012 | Yeh | H01L 23/5223 257/516 |
| 2012/0280366 A1 | 11/2012 | Kamgaing et al. | |
| 2013/0087930 A1 | 4/2013 | Meinhold | |
| 2013/0323930 A1 * | 12/2013 | Chattopadhyay | H01L 21/02107 438/703 |
| 2014/0001597 A1 * | 1/2014 | Huang | H01L 23/5223 257/531 |
| 2014/0264896 A1 * | 9/2014 | Lu | H01L 23/5329 257/773 |

* cited by examiner

VOIDS IN INTERCONNECT STRUCTURES AND METHODS FOR FORMING THE SAME

CROSS-REFERENCE TO RELATED APPLICATIONS

The present application is a continuation of U.S. patent application Ser. No. 13/539,121, filed on Jun. 29, 2012, entitled "Voids in Interconnect Structures and Methods for Forming the Same," which application is hereby incorporated herein by reference.

BACKGROUND

Passive devices such as inductors, transformers, transmission lines, or the like are commonly used in Radio Frequency (RF) applications. Due to the short wavelengths of the RF signals, the RF devices, which have relatively large sizes compared to the small wavelengths, have significant cross-talks with each other, and with nearby conductive components. The performance of the RF devices is thus affected significantly by the nearby conductive features and devices.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Voids that surround a passive device and the method of forming the same are provided in accordance with various exemplary embodiments. The intermediate stages of forming the voids and the passive device are illustrated. The variations of the embodiments are discussed. Throughout the various views and illustrative embodiments, like reference numbers are used to designate like elements.

Figure 1:
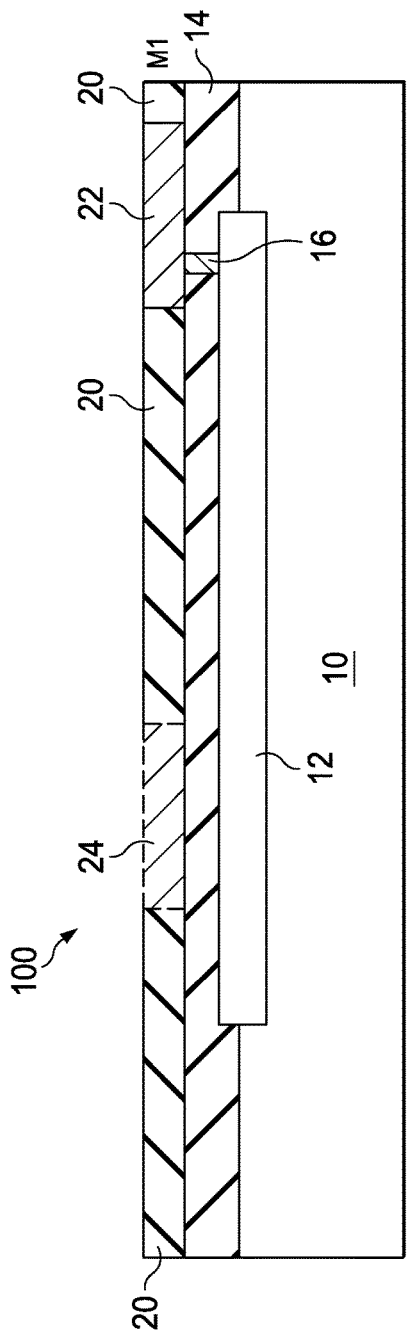
FIGS. 1 through 13 are cross-sectional views of intermediate stages in the manufacturing of voids adjacent to a passive device in accordance with some exemplary embodiments.

FIG. 1 illustrates wafer 100, which includes semiconductor substrate 10. Semiconductor substrate 10 may be formed of silicon, germanium, silicon germanium, III-V compound semiconductor, or the like. Active and passive devices 12, such as transistors, capacitors, resistors, and the like, may be formed adjacent to the top surface of semiconductor substrate 10.

FIG. 1 also illustrates the formation of Inter-Layer Dielectric (ILD) 14 and contact plug 16 in ILD 14. ILD 14 may be formed of Phospho-Silicate Glass (PSG), Boro-Silicate Glass (BSG), Boron-Doped Phospho-Silicate Glass (BPSG), Tetraethyl Orthosilicate (TEOS) oxide, or the like. Contact plug 16 may comprise tungsten. Dielectric layer 20 is formed over ILD 14. Dielectric layer 20 is alternatively referred to as an Inter-Metal Dielectric (IMD) layer. In some embodiments, IMD layer 20 comprises a low-k dielectric material, which has a dielectric constant (k value) lower than 3.9. The k value of IMD layer 20 may also be lower than about 3.0, or lower than about 2.5.

Metal line 22 is formed in IMD layer 20. In some embodiments, metal line 24, which may be a part of passive device 102 (FIGS. 13 through 15), is also formed in IMD layer 20. In alternative embodiments, passive device 102 does not extend into IMD layer 20. Throughout the description, the metal lines in an IMD layer are collectively referred to as a metal layer. Accordingly, metal lines 22 and 24 are in bottom metal layer M1.

Figure 2:
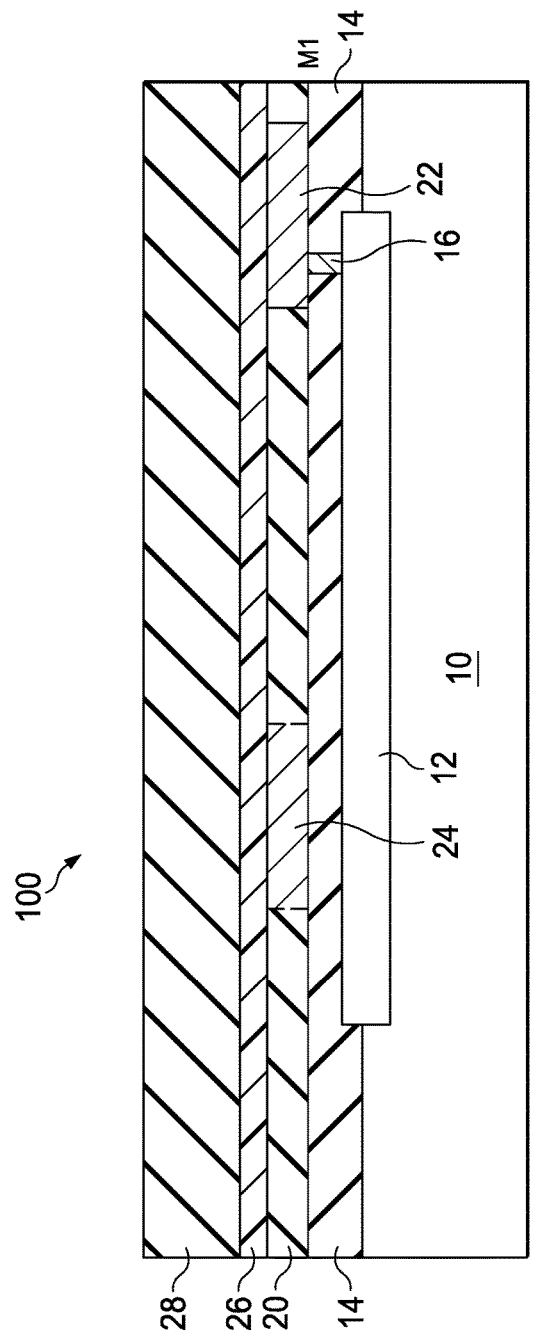

Referring to FIG. 2, Etch stop layer (ESL) 26 is formed over dielectric layer 20 and conductive lines 22 and 24. ESL 26 may include a nitride, a silicon and carbon based dielectric, a carbon-doped oxide, or the like. ESL 26 may have a k value close to or greater than about 3.9. An exemplary formation method includes Plasma Enhanced Chemical Vapor Deposition (PECVD). However, other commonly used methods such as High-Density Plasma CVD (HDP-CVD), Atomic Layer CVD (ALCVD), and the like can also be used. Next, IMD layer 28 is formed. In some embodiments, IMD layer 28 has a dielectric constant (k value) lower than about 3.5, hence is referred to as low-k IMD layer 28 throughout the description. The k value of low-k IMD layer 28 may also be lower than about 2.8. In some embodiments, low-k IMD layer 28 includes oxygen, silicon, nitrogen, and the like. The exemplary materials include carbon-containing materials, organo-silicate glass, porogen-containing materials, and the like. Pores may be formed in low-k IMD layer 28 for lowering its k value. Low-k IMD layer 28 may be deposited using a CVD method such as PECVD, although other deposition methods such as LPCVD, ALCVD, and spin-on can also be used.

Figure 3:
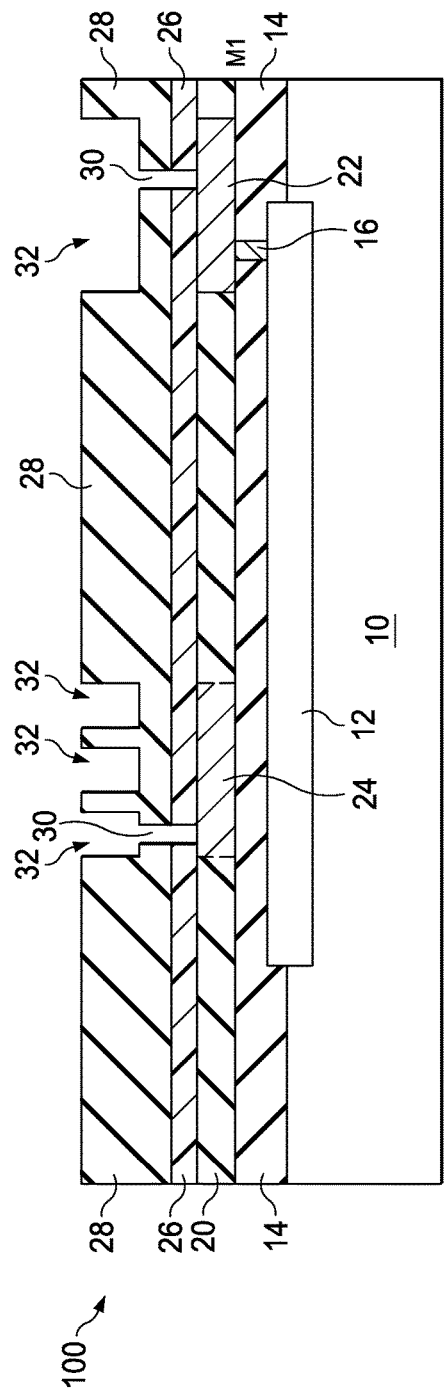
Figure 4:
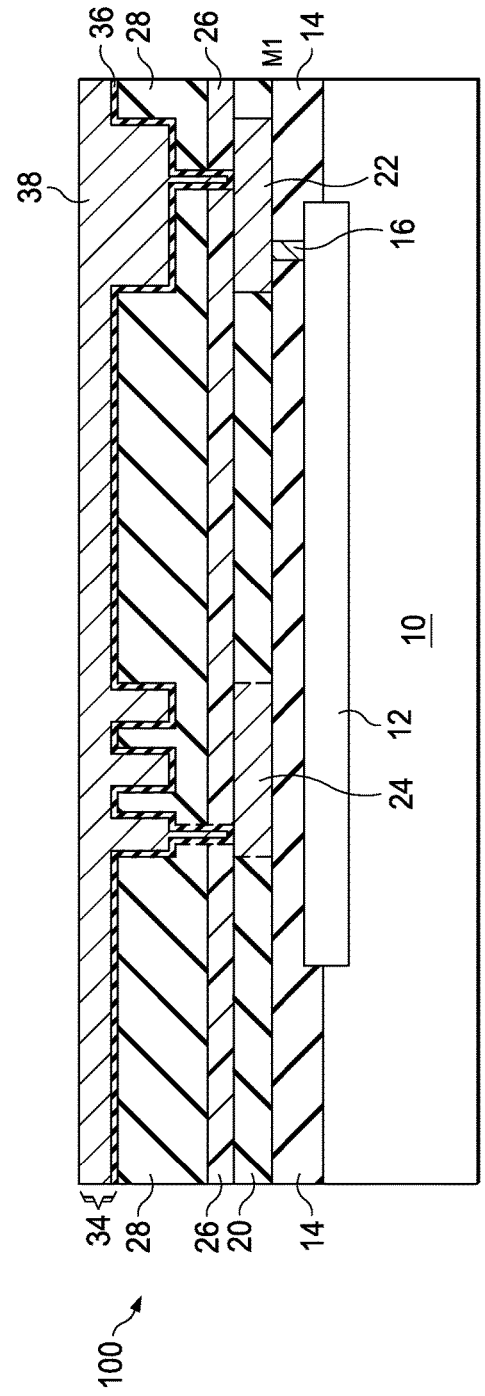
Figure 5:
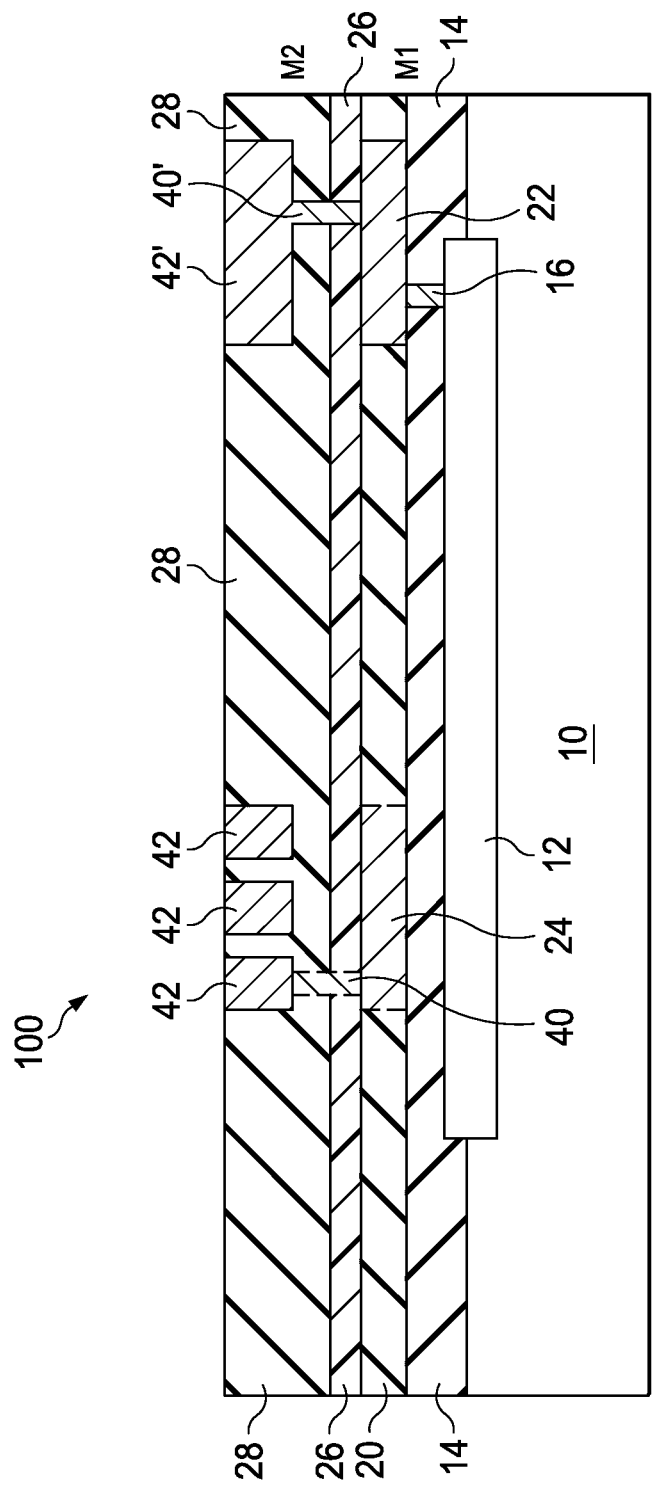

A dual damascene process is shown in FIGS. 3 through 5. FIG. 3 illustrates the formation of via openings 30 and trench openings 32 in low-k IMD layer 28. Photo resists (not shown) are first formed and patterned over low-k IMD layer 28 to aid the formation of via openings 30 and trench openings 32. In some embodiment, an anisotropic etch is performed to etch through low-k IMD layer 28 and stops at ESL 26, thereby forming via openings 30. Trench openings 32 are also formed through etching. The etching time is controlled so that the etching of trench openings 32 stops at a desirable depth. ESL 26 is then etched through via opening 30, exposing underlying conductive lines 22 and 24, if any. In alternative embodiments wherein metal line 24 is not formed, the via opening 30 that is illustrated as overlying metal lines 24 may not be formed.

FIG. 4 illustrates the filling of conductive material 34 in via openings 30 and trench openings 32. In some embodiments, the filling process includes blanket depositing diffusion barrier layer 36, forming a seed layer (not shown) over diffusion barrier layer 36, and performing a plating step to form copper-containing material 38, until the top surface of copper-containing material 38 is higher than the top surface of low-k IMD layer 28. Diffusion barrier layer 36 may include titanium, titanium nitride, tantalum, tantalum nitride, or other alternatives.

Next, as shown in FIG. 5, a Chemical Mechanical Polish (CMP) is performed to remove the excess portions of copper-containing material 38 and diffusion barrier layer 36 that are over low-k IMD layer 28, leaving metal line 42 and vias 40 in IMD layer 28. Metal line 42 and via 40 are parts of the resulting passive device 102. In addition, metal line 42' and vias 40' are also formed in IMD layer 28, and are used for interconnection. Throughout the description, all metal lines 42 and 42' in IMD layer 28 are collectively referred to metal layer M2.

Figure 6:
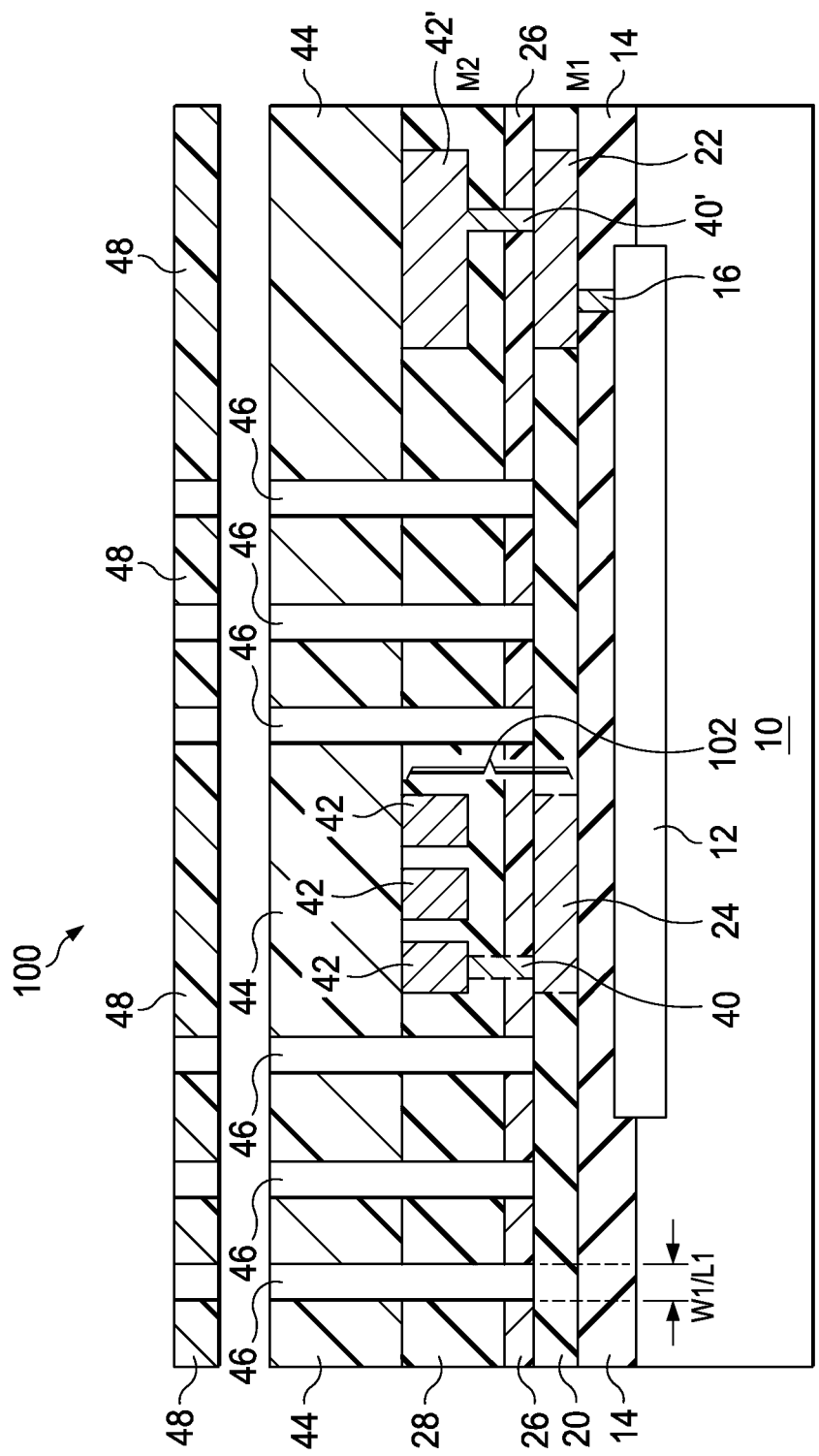
Figure 15:
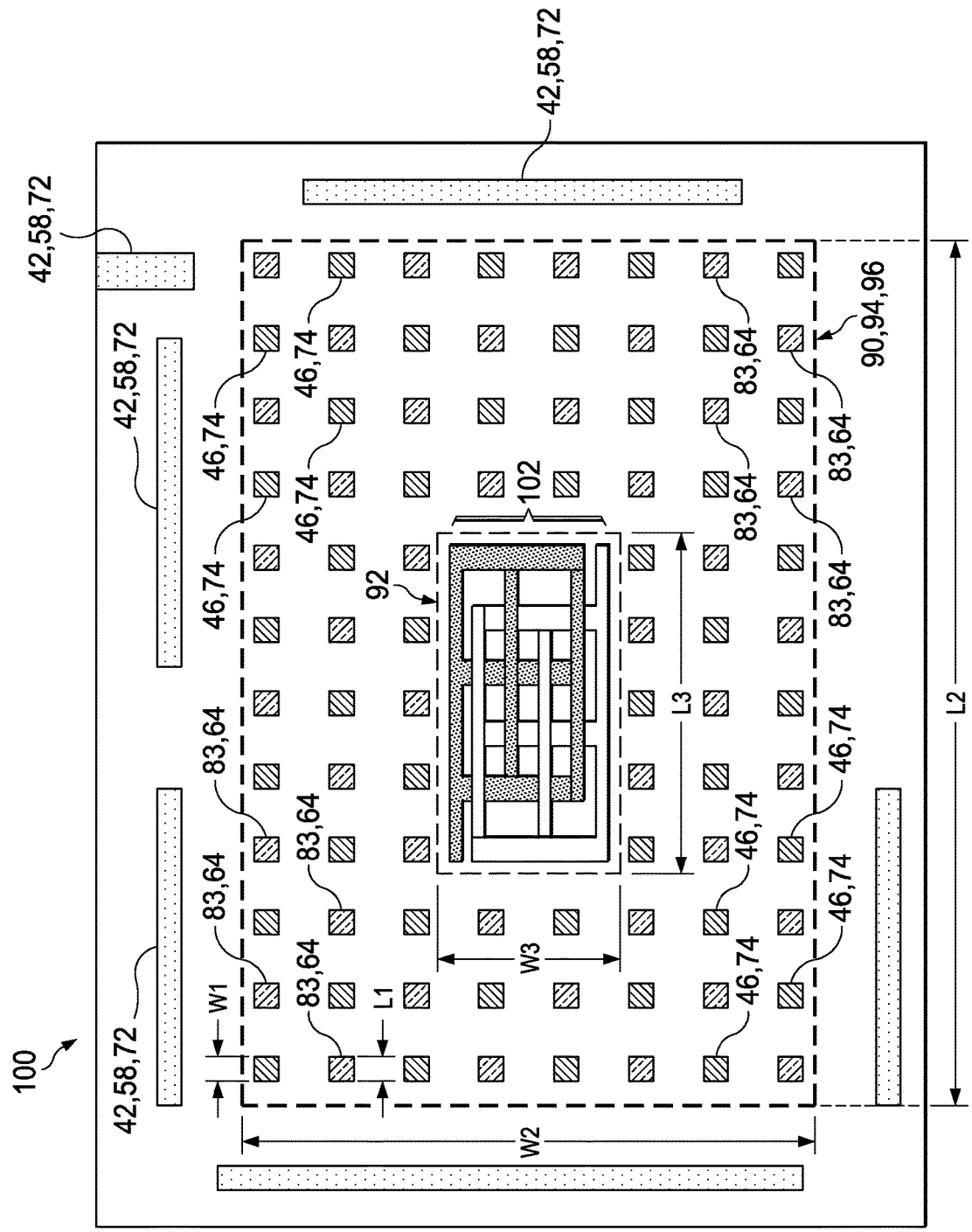
FIG. 15 illustrates a top view of the structure in FIG. 13.

FIG. 6 illustrates the formation of openings 46 in low-k IMD layer 28 and ESL 26. In some embodiments, photo resist 44 is applied, and is then exposed and developed. In the exposing of photo resist 44, lithography mask 48 is used, wherein lithography mask 48 includes opaque portions for blocking the light that is used for exposing, and transparent portions for allowing the light to pass through. In the formation of openings 46, low-k IMD layer 28 is etched first in a first etching step, with ESL 26 acting as the etch stop layer in the etching of low-k IMD layer 28. Next, using same photo resist 44 as the etching mask, ESL 26 is etched in a second etching step, with the underlying IMD layer 20 acting as the etch stop layer. The first and the second etching steps may use different etching gases and different process conditions. Accordingly, openings 46 penetrate through ESL 26 and reach the top surface of IMD layer 20. In alternative embodiments, the second etching step is skipped, and hence ESL 26 is not etched. Openings 46 have length L1 or width W1 between about 50 nm and about 400 nm in some embodiments. The top-view shapes (as shown in FIG. 15) of openings 46 may be squares, circles, or the like. Openings 46 are formed surrounding passive device 102.

Figure 7:
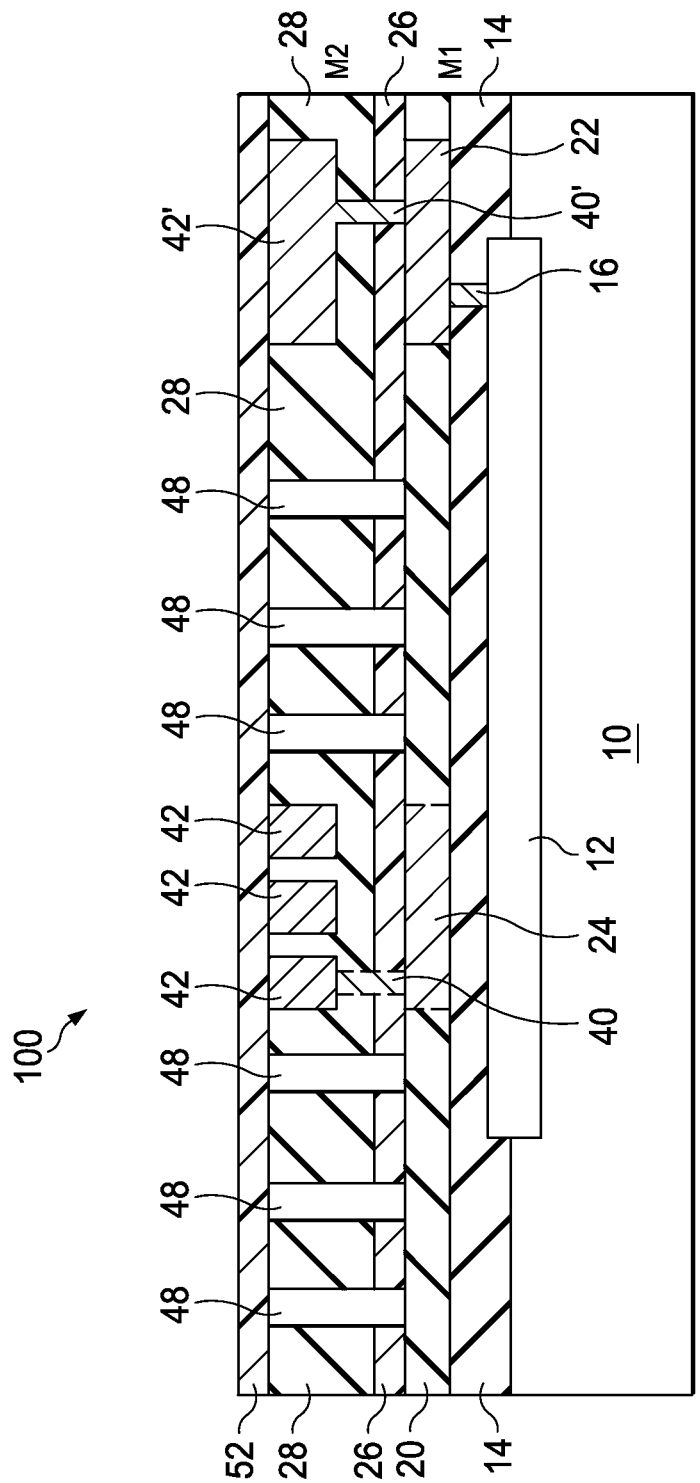

Next, as shown in FIG. 7, ESL 52 is formed over IMD layer 28. The material of ESL 52 may be selected from the same group of available materials for forming ESL 26. The formation methods may include PECVD, HDPCVD, or the like. The formation method of ESL 52 is also selected so that openings 46 are not filled substantially. Accordingly, openings 46 are sealed, and hence are referred to as voids 46 hereinafter. In subsequent processes, openings 46 may be filled with air, or may be vacuumed or partially vacuumed (with the internal pressure lower than one atmosphere).

Figure 8:
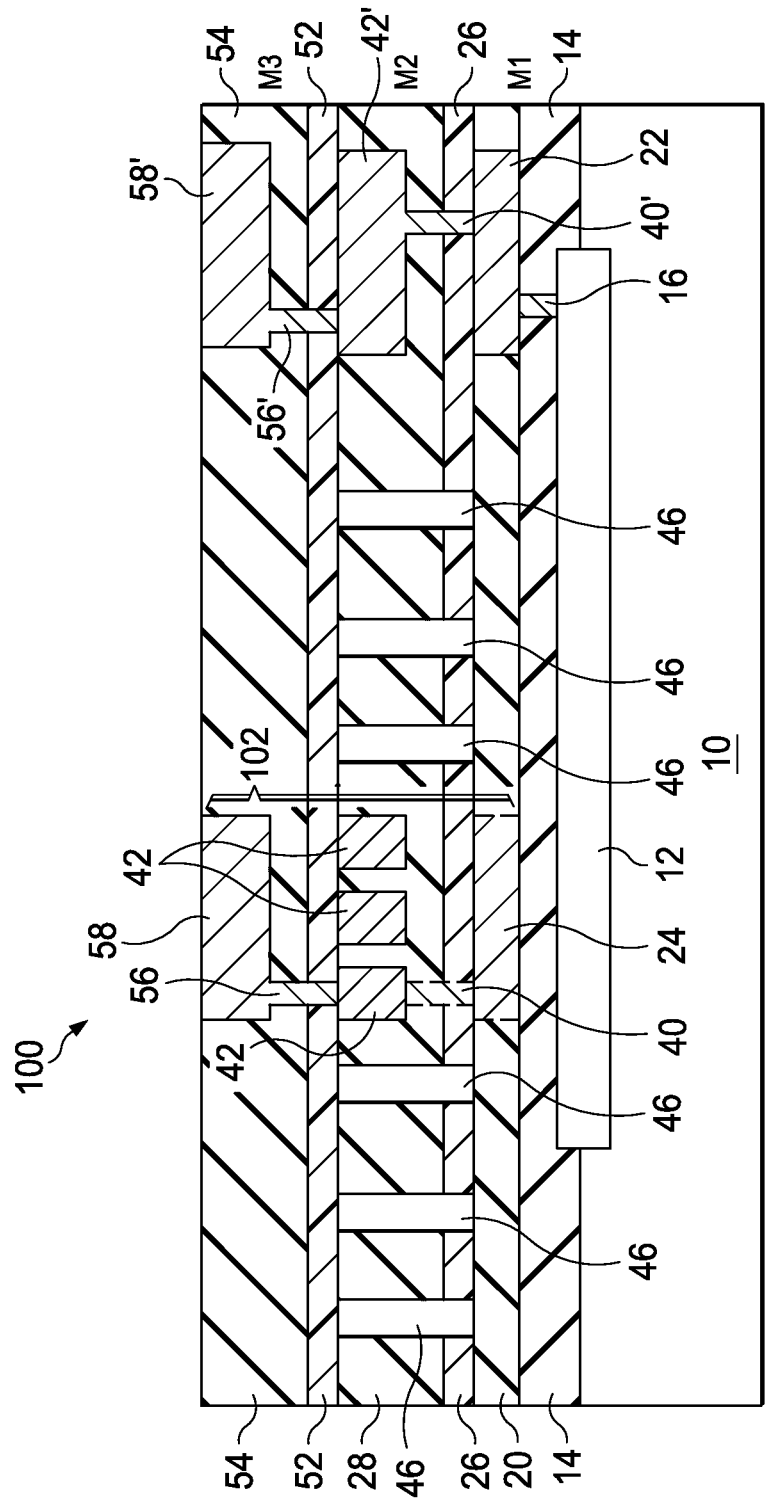

FIG. 8 illustrates the formation of metal layer M3. IMD layer 54 is formed over ESL 52, wherein IMD layer 54 may be formed of a material selected from the same group of available materials for forming IMD layer 28. Next, vias 56 and 56' and metal lines 58 and 58' are formed using a dual damascene process. Metal line 58 and via 56 form parts of passive device 102, and are connected to metal lines 42.

Figure 9:
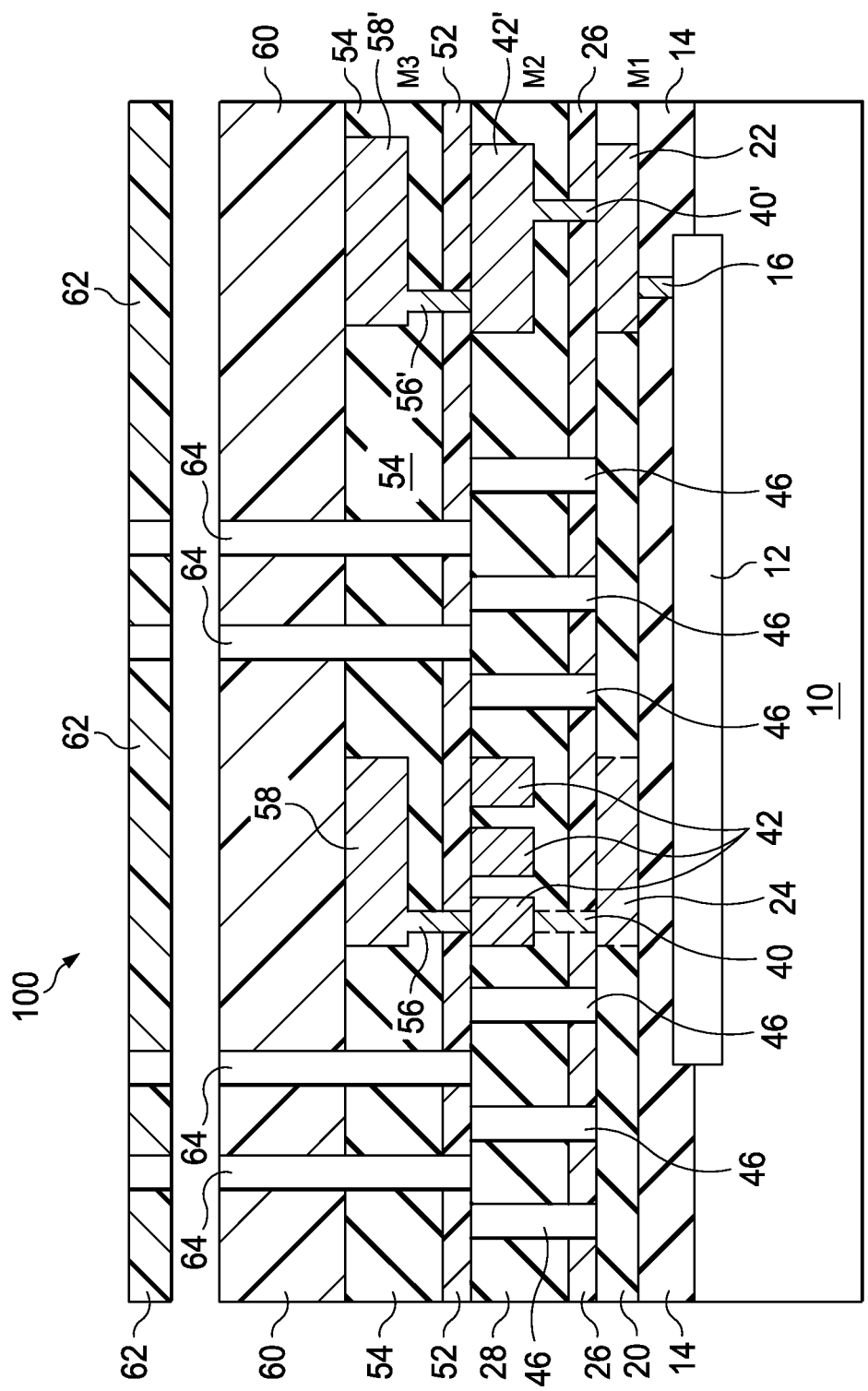

In a subsequent step, as shown in FIG. 9, photo resist 60 is applied and exposed using lithography mask 62. Photo resist 60 is then used as the etching mask to etch IMD layer 54 and ESL 52. The etching process may be essentially the same as the etching of IMD layer 28 and ESL 26. Openings 64 surround passive device 102. In some embodiments, openings 64 are misaligned with voids 46, and openings 64 are not connected to the underlying voids 46. To achieve the misalignment, the patterns of lithography mask 62 are different from that in lithography mask 48 (FIG. 6). In alternative embodiments, openings 64 are aligned to voids 46. To achieve the alignment, the same lithography mask 48 that is used in the step in FIG. 6 is also used as lithography mask 62.

Figure 10:
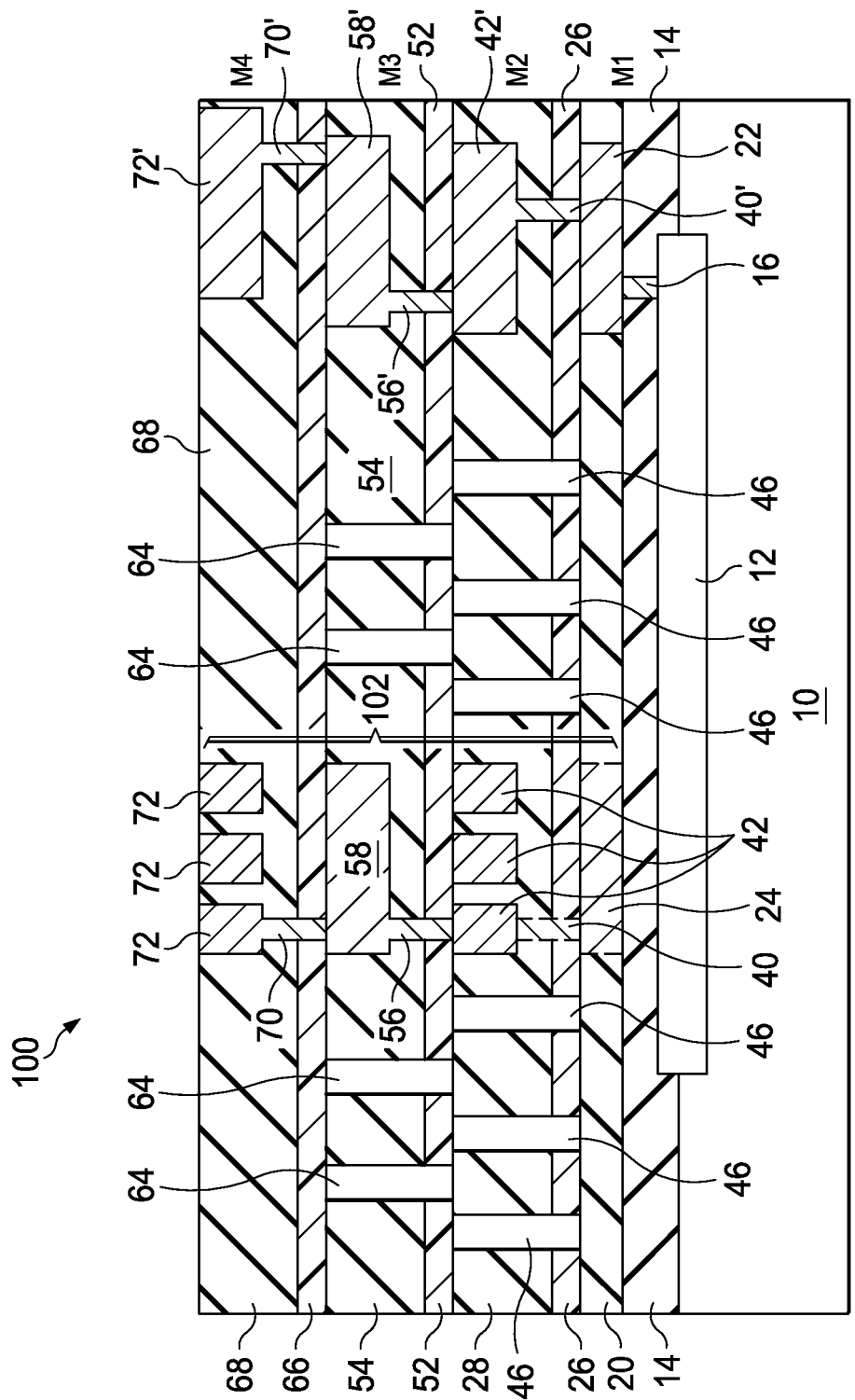

FIG. 10 illustrates the formation of metal layer M4. ESL 66, IMD layer 68, metal lines 72 and 72', and vias 70 and 70' are formed. The formation may use the similar dual damascene process as in FIGS. 3 through 5. Metal line 72 and via 70 may form a further portion of passive device 102. Openings 64 are sealed by ESL 66 to form voids. Next, in FIG. 11, openings 74 are formed using photo resist 76 as an etching mask. The exposure of photo resist 76 may be performed using lithography mask 78, which may be the same lithography mask 48 in FIG. 6. Accordingly, openings 74 may be aligned to the respective underlying voids 46. In alternative embodiments, lithography mask 78 has patterns different from the patterns of both lithography masks 48 (FIG. 6) and 62 (FIG. 9), and hence openings 74 are misaligned with voids 46 and 64.

Figure 12:
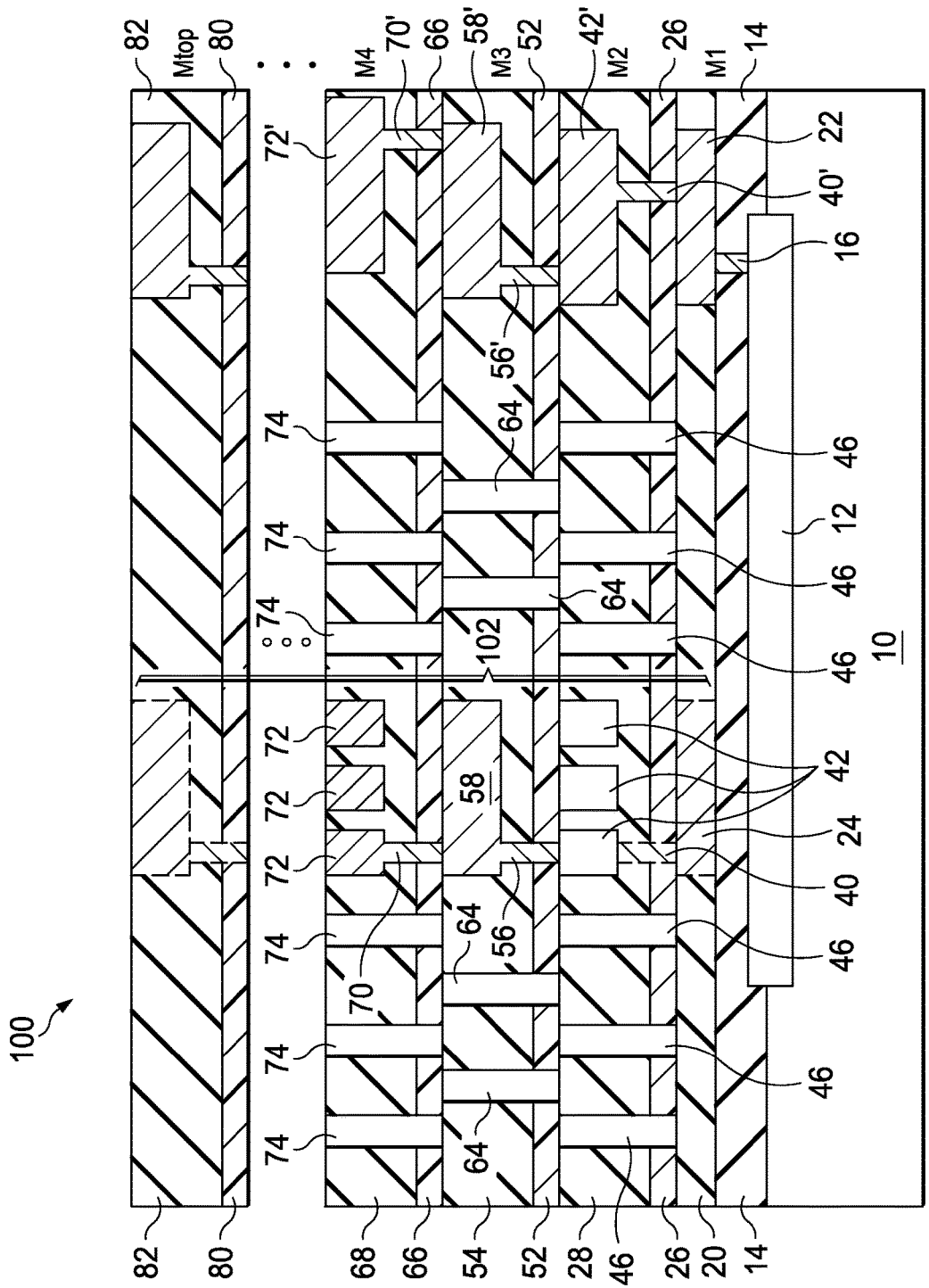

FIG. 12 illustrates the formation of more IMD layers and metal layers over metal layer M4, and the formation of the respective ESLs, the metal lines, and the vias. IMD layer 82 is the top one of the plurality of IMD layers, with metal layer Mtop formed therein. ESL 80 is underlying and in contact with IMD layer 82. IMD layer 82 may also be a low-k dielectric layer. Passive device 102 may extend into IMD layer 82, or may be underlying IMD layer 82.

Figure 11:
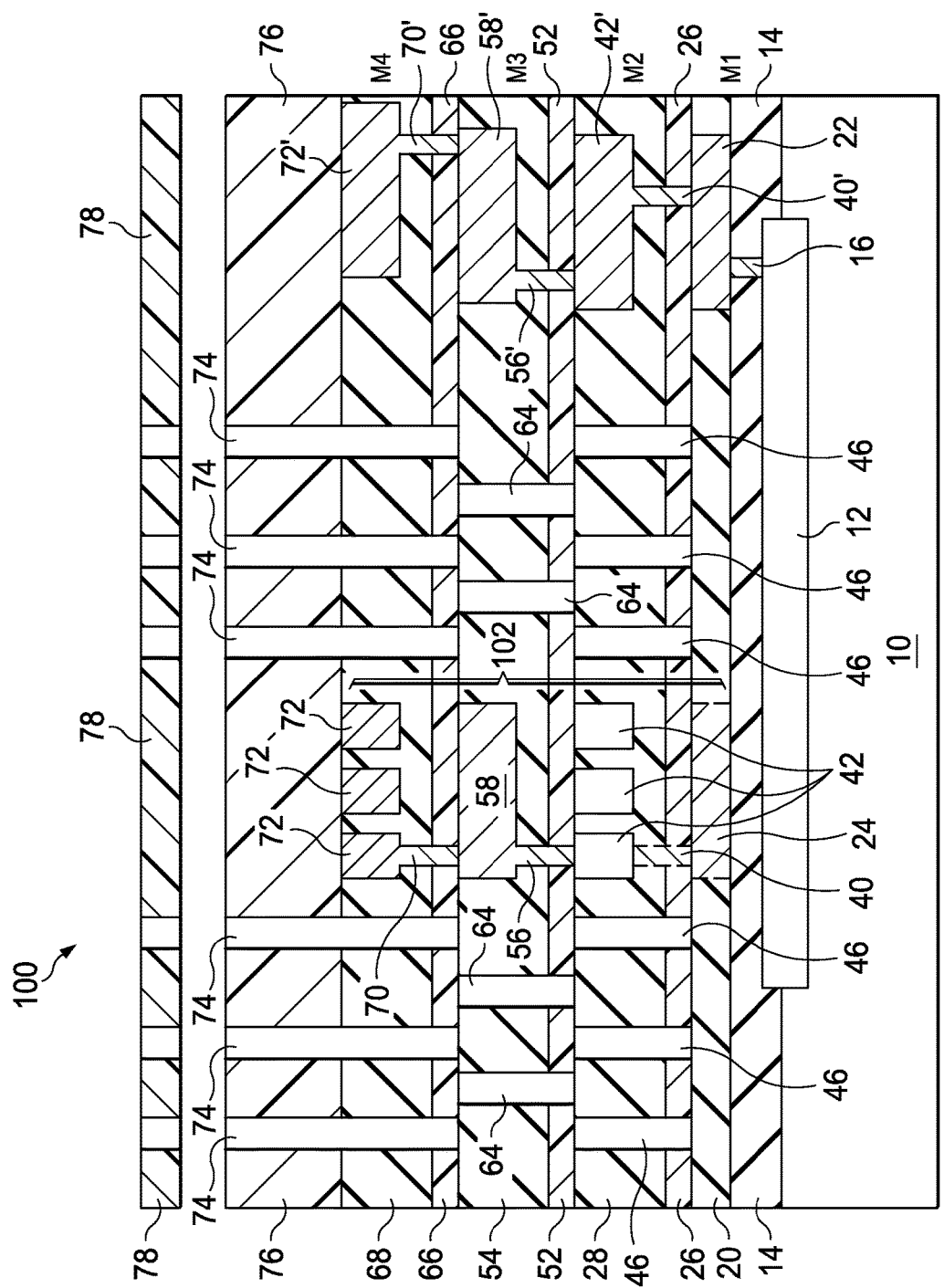
Figure 13:
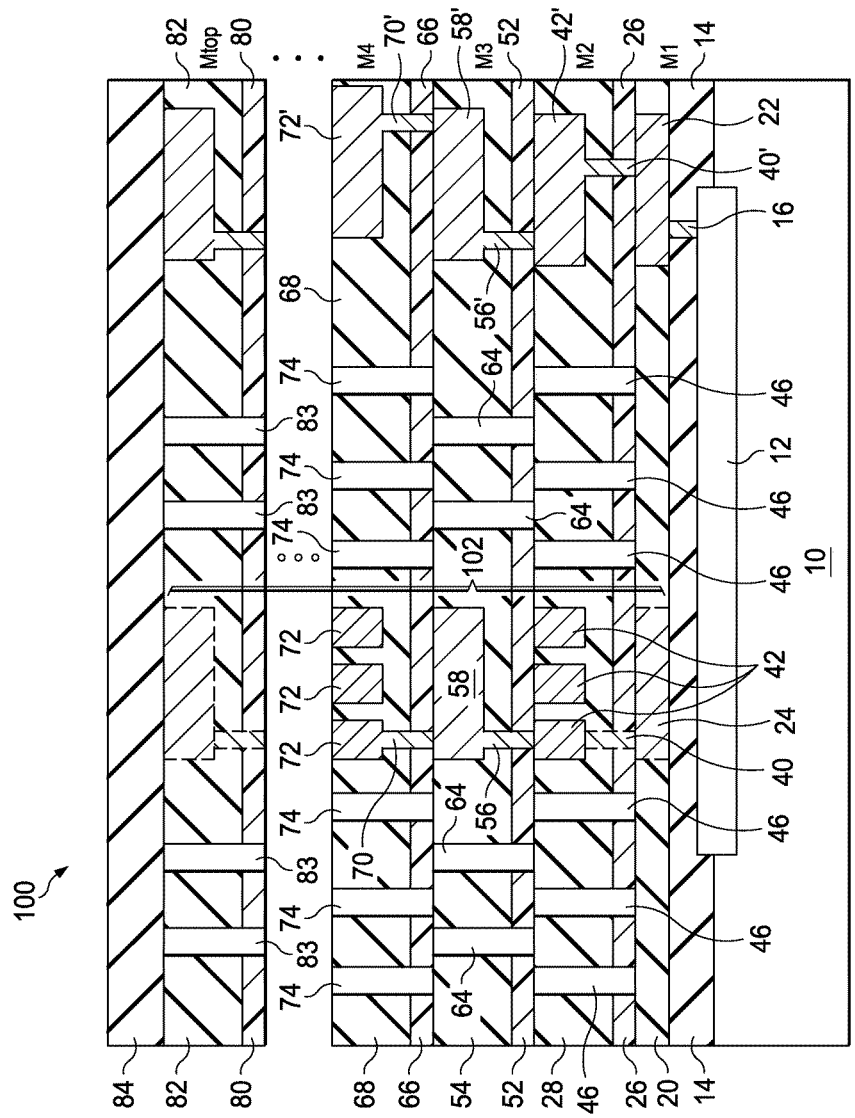

Next, as shown in FIG. 13, voids 83 are formed in IMD layer 82 and ESL 80. The formation of voids 83 may reuse one of the lithography masks such as 48 (FIG. 6), 62 (FIG. 9), or 78 (FIG. 11). Non-low-k dielectric layers 84, which may include passivation layers, are formed over IMD layer 82, and seal voids 83. Non-low-k dielectric layers 84 may have k values close to or greater than about 3.9. Conductive lines (not shown) may be formed in non-low-k dielectric layers 84. In some embodiments, passive device 102 extends into the non-low-k dielectric layers 84. In alternative embodiments, passive device 102 is below non-low-k dielectric layers 84. Voids that surround passive device 102, however, may not extend into non-low-k dielectric layers 84.

Figure 14:
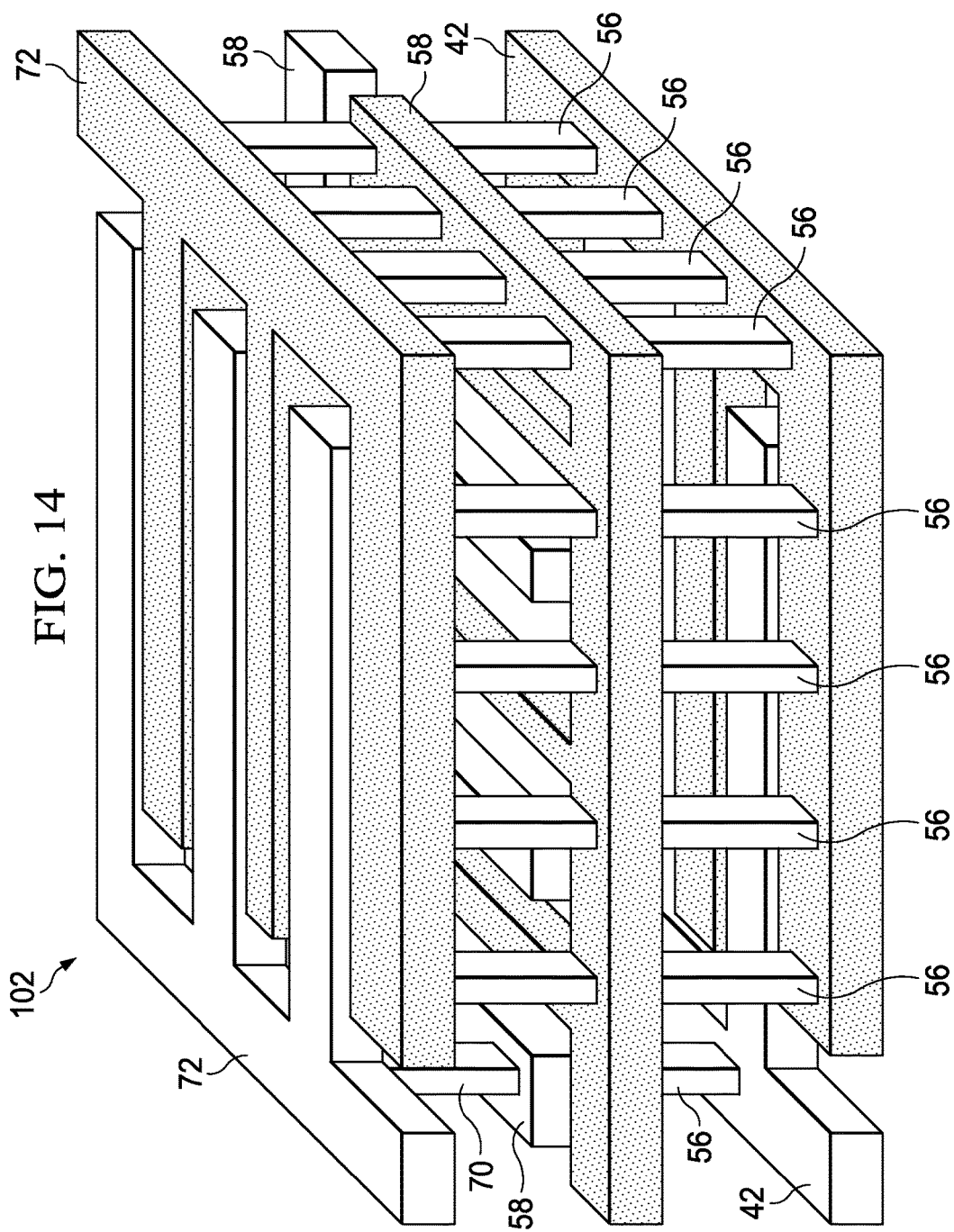
FIG. 14 illustrates a perspective view of an exemplary passive device, which is a Metal-Oxide-Metal (MOM) capacitor.

FIG. 14 illustrates an exemplary passive device 102. In some embodiments, passive device 102 is a Metal-Oxide-Metal (MOM) capacitor. MOM capacitor 102 includes a plurality of buses and fingers connected to the buses, wherein the buses and fingers are the metal lines such as 42, 58, and 72. The buses and fingers may also include vias such as 40 (refer to FIG. 13), 56, and 70. The bottom layer of MOM capacitor 102 may be in any of IMD layers M1 through Mtop (FIG. 13). The top layer of MOM capacitor 102 may be in any of IMD layers M2 through Mtop, or higher. In alternative embodiments, passive device 102 may be a resistor, a capacitor, an inductor, a transformer, a balun, a micro-stripe, a co-planar waveguide, or the like.

FIG. 15 illustrates a top view of passive device 102 and voids 46, 64, 74, and 83. The regions of IMD layers 28, 54, 68 and/or 82, in which passive device 102 is formed, are denoted as first region 92. Voids 46, 64, 74, and 83 are distributed in a second region 90, which is in the same IMD layers as first region 92, wherein second region 90 encircles first region 92. Furthermore, when viewed in a cross-sectional view, voids 46, 64, 74, and 83 are also formed in third region 94 that overlaps second region 90, and/or a fourth region 96 that is overlapped by the second region 90. For example, referring to FIG. 13, assuming passive device 102 is formed in metal layers M2 and M3, then voids 83 are formed in third region 94, voids 46 are formed in fourth region 96, and voids 64 and 74 are formed in second region 90.

Voids 46, 64, 74, and 83 may be distributed substantially evenly in regions 90, 94, and 96. Voids 46, 64, 74, and 83 may not be formed to overlap, or overlapped by, passive device 102. The spacing between neighboring voids 46, 64, 74, and 83 may be as small as, or greater than, the minimum spacing (allowed by design rules) of neighboring metal lines in the same IMD layer. In some exemplary embodiments, in region 90, there are substantially no conductive features formed except passive device 102 and the electrical connections (not shown) that are used for connecting passive device 102 to the circuits in wafer 100.

In the embodiments, by forming voids encircling passive devices, the effective k value of the dielectric material that is located between the passive devices and neighboring metal features is reduced. Accordingly, the performance of the passive devices is affected less by the neighboring conductive features. This is particularly helpful when the passive device is operated under the radio frequency.

In accordance with embodiments, a device includes a dielectric layer, a passive device including a portion in the dielectric layer, and a plurality of voids in the dielectric layer and encircling the passive device.

In accordance with other embodiments, a device includes a semiconductor substrate, a plurality of low-k dielectric layers over the semiconductor substrate, and a non-low-k dielectric layer over the plurality of low-k dielectric layers. A passive device includes a portion in a first region of a first one of the plurality of low-k dielectric layers, wherein the passive device includes a metal line and a via underlying and joined to the metal line. A plurality of voids is distributed in a second region of the first one of the plurality of low-k dielectric layers. The second region encircles the first region. A first portion of the plurality of voids is level with the metal line, and a second portion of the plurality of voids is level with the via.

In accordance with other embodiments, a method includes forming a first etch stop layer over a semiconductor substrate, forming a first low-k dielectric layer over the first etch stop layer, and forming a first portion of a passive device in the first low-k dielectric layer. After the step of forming the first portion of the passive device, the first low-k dielectric layer is etched to form a first plurality of openings in the first low-k dielectric layer. A second etch stop layer is formed over the first low-k dielectric layer, wherein the first plurality of openings remains after the second etch stop layer is formed. A second low-k dielectric layer is formed over the second etch stop layer. The second low-k dielectric layer is etched to form a second plurality of openings in the second low-k dielectric layer. An upper dielectric layer is formed over the second low-k dielectric layer, wherein the second plurality of openings remains after the upper dielectric layer is formed.

In accordance with other embodiments, a device includes a first dielectric layer, a second dielectric layer over the first dielectric layer, a passive device at least partially disposed in the first dielectric layer and the second dielectric layer. The passive device comprises a Metal-Oxide-Metal (MOM) capacitor, a resistor, an inductor, a transformer, a balun, a micro-stripe, or a co-planar waveguide. The device further includes first voids in the first dielectric layer and encircling the passive device and second voids in the second dielectric layer and encircling the passive device.

In accordance with other embodiments, a device includes a semiconductor substrate, a plurality of low-k dielectric layers over the semiconductor substrate, a non-low-k dielectric layer over the plurality of low-k dielectric layers, and a passive device comprising a portion in a first one of the plurality of low-k dielectric layers. The passive device includes a Metal-Oxide-Metal (MOM) capacitor, a resistor, an inductor, a transformer, a balun, a micro-stripe, or a co-planar waveguide. Voids are formed in each of the plurality of low-k dielectric layers, and at least a first subset of the voids encircles the portion of the passive device in the first one of the plurality of low-k dielectric layers.

In accordance with yet other embodiments, a method includes forming a first low-k dielectric layer a semiconductor substrate, forming a first portion of a passive device in the first low-k dielectric layer, etching the first low-k dielectric layer to form a first plurality of openings in the first low-k dielectric layer forming a etch stop layer over the first low-k dielectric layer, and forming an upper dielectric layer over the etch stop layer. Etching the first low-k dielectric layer and forming the first portion of the passive device are performed non-simultaneously, and the etch stop layer seals the first plurality of openings to form a first plurality of voids in the first low-k dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first dielectric layer;
a second dielectric layer over the first dielectric layer;
a passive device at least partially disposed in the first dielectric layer and the second dielectric layer, wherein the passive device comprises a Metal-Oxide-Metal (MOM) capacitor, a resistor, an inductor, a transformer, a balun, a micro-stripe, or a co-planar waveguide;
first voids in the first dielectric layer and encircling an outermost perimeter of an entirety of the passive device in a top down view; and
second voids in the second dielectric layer and encircling the outermost perimeter of the entirety of the passive device in the top down view.

2. The device of claim 1, wherein the first dielectric layer is a low-k dielectric layer, wherein the device further comprises a etch stop layer under the first dielectric layer.

3. The device of claim 2, wherein the first voids extend through the etch stop layer.

4. The device of claim 2, wherein tops of the first voids are lower than a bottom surface of the etch stop layer.

5. The device of claim 1, wherein the first voids are aligned with the second voids.

6. The device of claim 1, wherein the first voids are misaligned with the second voids.

7. The device of claim 1 further comprising a non-low-k dielectric layer over the second dielectric layer, wherein no voids surrounding the passive device are formed in the non-low-k dielectric layer.

8. A device comprising:
a semiconductor substrate;
a plurality of low-k dielectric layers over the semiconductor substrate, wherein voids are formed in each of the plurality of low-k dielectric layers;
a non-low-k dielectric layer over the plurality of low-k dielectric layers; and a passive device comprising a portion in a first one of the plurality of low-k dielectric layers, wherein the passive device comprises a Metal-Oxide-Metal (MOM) capacitor, a resistor, an inductor, a transformer, a balun, a micro-stripe, or a co-planar waveguide, and wherein at least a first subset of the voids encircles the portion of the passive device.

9. The device of claim 8 further comprising an etch stop layer underlying the at least one of the plurality of low-k dielectric layers, and each of the plurality of the first subset of the voids comprises a bottom substantially level with a top surface of the etch stop layer.

10. The device of claim 8, wherein the passive device extends into a second one of the plurality of low-k dielectric layers, wherein the passive device and is below a third one of the plurality of low-k dielectric layers, and wherein a second subset of the voids are disposed in the third one of the plurality of low-k dielectric layers, and wherein the second subset of the voids overlaps the first subset of the voids and forms a ring.

11. The device of claim 8, wherein substantially no void is disposed in a region of the non-low-k dielectric layer, and wherein the region overlaps the first subset of the voids and forms a ring.

12. The device of claim 8, wherein the passive device comprises a metal line and a via underlying and joined to the metal line, wherein a first portion of the first subset of the voids is level with the metal line, and wherein a second portion of the first subset of the voids is level with the via.

13. The device of claim 8 further comprising a bottom metal layer of a chip that comprises the semiconductor substrate, wherein no voids are formed in the bottom metal layer.

14. A device comprising:
a first dielectric layer comprising a low-k material;
a first plurality of voids extending through the first dielectric layer;
an etch-stop layer over the first dielectric layer, wherein the etch-stop layer comprises a different material than the first dielectric layer;
a second dielectric layer over the etch-stop layer, wherein the second dielectric layer comprises a low-k material;
a second plurality of voids extending through the second dielectric layer; and
a passive device at least partially disposed in the first dielectric layer and the second dielectric layer, wherein the passive device comprises a Metal-Oxide-Metal (MOM) capacitor, a resistor, an inductor, a transformer, a balun, a micro-stripe, or a co-planar waveguide, and wherein the first plurality of voids and the second plurality of voids are disposed along all sides of the passive device in a top-down view of the device.

15. The device of claim 14, wherein a line extending through the first dielectric layer and a first void of the first plurality of voids also extends through a second void of the second plurality of voids.

16. The device of claim 14, wherein a line extending through the first dielectric layer and a first void of the first plurality of voids does not extend through any of the second plurality of voids.

17. The device of claim 16, further comprising a third dielectric layer over the second dielectric layer, wherein the third dielectric layer comprises a third plurality of voids disposed along all sides of the passive device in the top-down view of the device, and wherein the line extends through a third void of the third plurality of voids.

18. The device of claim 14, wherein the second plurality of voids extends through the etch-stop layer.

19. The device of claim 14, wherein the etch-stop layer seals tops of the first plurality of voids.

20. The device of claim 14 further comprising a conductive line in the first dielectric layer electrically connected to an active device, wherein at least a portion of the first plurality of voids is disposed between the conductive line and the passive device.

* * * * *